(12) United States Patent
Kim

(10) Patent No.: US 7,498,834 B2
(45) Date of Patent: Mar. 3, 2009

(54) SEMICONDUCTOR MEMORY DEVICE

(75) Inventor: Yong-Mi Kim, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 610 days.

(21) Appl. No.: 11/321,454

(22) Filed: Dec. 30, 2005

(65) Prior Publication Data

US 2007/0002988 A1    Jan. 4, 2007

(30) Foreign Application Priority Data

Jun. 30, 2005  (KR) ...................... 10-2005-0058712

(51) Int. Cl.
*H03K 17/16* (2006.01)
*H03K 19/003* (2006.01)
(52) U.S. Cl. ............................ 326/30; 326/32; 326/34; 326/28; 326/26
(58) Field of Classification Search ............. 326/26–28, 326/30, 32–34
See application file for complete search history.

(56) References Cited

U.S. PATENT DOCUMENTS

| 6,392,957 | B1 | 5/2002 | Shubat et al. |
| 6,707,743 | B2 | 3/2004 | Leung et al. |
| 6,768,698 | B2 | 7/2004 | Kono |
| 2004/0100837 | A1 | 5/2004 | Lee |
| 2004/0141391 | A1 | 7/2004 | Lee et al. |
| 2004/0228196 | A1 | 11/2004 | Kwak et al. |
| 2005/0248375 | A1* | 11/2005 | Jung .......................... 327/108 |
| 2008/0164904 | A1* | 7/2008 | Kim ............................ 326/30 |

FOREIGN PATENT DOCUMENTS

| JP | 2003-345735 A | 12/2003 |
| JP | 2004-310981 A | 11/2004 |
| TW | 583686 | 4/2004 |
| TW | 588360 | 5/2004 |
| TW | 200414195 | 8/2004 |

OTHER PUBLICATIONS

Taiwanese Office Action Issued in Taiwanese Patent Application No. TW 094147401, mailed May 22, 2007.

\* cited by examiner

*Primary Examiner*—Anh Q Tran
(74) *Attorney, Agent, or Firm*—McDermott Will & Emery LLP

(57) ABSTRACT

A semiconductor memory device according to the present invention can change adjusting timing of ODT operation in convenience and have an optimized ODT timing whether the semiconductor memory device is putted on ether rank of a module. The present invention includes an impedance adjusting unit for adjusting an impedance value of an input pad in response to an impedance selecting signal; an ODT operating control unit for controlling the impedance adjusting unit as generating the impedance selection signal using an decoding signal and an ODT timing signal; a delay adjusting unit for delaying an internal control clock for a predetermined timing to thereby generate the ODT timing signal; and an ODT timing control unit for controlling the delay adjusting unit to decide the value of the predetermined timing according to whether or not the semiconductor memory device is arranged to a first rank or a second rank in a module.

17 Claims, 11 Drawing Sheets

SEMICONDUCTOR MEMORY DEVICE

FIELD OF THE INVENTION

The present invention relates to a semiconductor memory device for controlling On Die Termination (hereinafter referred to as ODT).

DESCRIPTION OF RELATED ARTS

Generally, a semiconductor memory device is used for main memory of a Micro Processor. A predetermined Circuit, such as a 'Chipset', located between the Micro Processor and the semiconductor memory device controls a data transmission between them. The Chipset provides output data from the Micro Processor to the semiconductor and data from the semiconductor to the Micro Processor.

When a data is delivered from the Chipset to the semiconductor memory device, i.e., the data outputted from the output buffer of the Chipset is inputted to an input buffer of the semiconductor memory device, a signal reflection must occur. The signal reflection is a phenomenon that a part of the data signal inputted to the semiconductor memory device reflects to a transmission line of the semiconductor memory device because of the impedance mismatching between the input buffer of the semiconductor memory device and the transmission line.

If an operating speed for delivering data is not high while the Chipset transmits the data from the Micro Processor to the semiconductor memory device continually, problem caused by the above descried signal reflection is not serious. As the operating speed becomes faster, problem caused by the above descried signal reflection is serious. That is to say, the Chipset may not be able to properly relay data between the Micro Processor and the semiconductor in stable situation because of the signal reflection.

The reflection of a first data delivered from the Micro Processor to the semiconductor memory device interferes with an inputted second data.

In order to overcome the interference among data inputted continually to the memory device, a termination resistor for matching the impedance between the transmission line and the input buffer of the semiconductor memory device is required in a Printed Circuit Board where the semiconductor memory device is placed.

FIG. 1 is a block diagram illustrating a module on which a semiconductor memory device resides.

Generally, a semiconductor memory device is fabricated in a module being adapted for some system. The module usually has two or more semiconductor memory devices.

The semiconductor memory devices in the module respectively input and output data with a chipset 1.

The module is conventionally formed from PCB having a rectangle shape.

The semiconductor memory devices respectively reside on both sides of the module. The module is placed in the board of a system. F or instance, the module is placed on a mother board for personal computer.

Each side of the module is called a rank. Therefore, the module has two ranks 2 and 3.

Each rank 2 and 3 of the module respectively inputs and outputs some data under the control of the Chipset 1. The impedance of a data transmission line between each of the ranks 2 and 3 and the Chipset 1 is different. Referring to FIG. 1, the impedance of data transmission line from the rank 3 to the Chipset 1 is higher than that of the other.

FIG. 2 is a schematic diagram illustrating a conventional circuit for controlling ODT used in a semiconductor memory device.

As above described, ODT control is to match the impedance between the input buffer of a semiconductor memory device and the transmission line.

The conventional circuit for controlling ODT includes a DLL pulse generator 10, a delay block 20, an ODT control block 30 and an impedance adjusting block 40.

The DLL pulse generator 10 transfers a delay locked clock outputted from delay lock loop as a DLL pulse signal to output the DLL pulse signal to delay block 20.

Herein, the delay locked clock is the signal which the delay lock loop outputs. The semiconductor memory device outputs an output data in synchronization with the delay locked clock in order to output an output data in synchronization with system clock.

The delay block 20 delays the DLL pulse signal by a predetermined delay time. The ODT control block 30 controls the impedance adjusting block 40, using the delayed DLL pulse signal and an ODT control signal ODTd.

The ODT control signal ODTd is a signal inputted from the Chipset for adjusting the input impedance of the input buffer in order to match the impedance between the input buffer of a semiconductor memory device and the transmission line.

The impedance adjusting block 40 adjusts the input impedance of an input pad inputting a data in response to controlling of the ODT control block. For example, the impedance adjusting block 40 adjusts the impedance value, ex 50 ohm, 70 ohm and 150 ohm, of the data input pad DQ.

FIG. 3 is a waveform and table illustrating a JDEC specification about ODT.

As shown, the JDEC specification defines the timings tAON and tAOF for matching an impedance difference between the input buffer of a semiconductor memory device and a data transmission line of a data transferred into/from the semiconductor memory device while an activated ODT signal ODT is inputted. The reference timing of the timing tAON and tAOF is determined upon a transition timing of system clock CK and /CK.

This is, a semiconductor memory device must adjust an impedance of a data input terminal for matching an impedance difference between the input buffer of the semiconductor memory device and a data transmission line.

The ODT control block 30 controls the impedance adjusting block 40 for adjusting the input impedance of the input buffer in order to match the impedance between the input buffer of the semiconductor memory device and the data transmission line.

However, in accordance with an environment of fabricating a semiconductor memory device, the characteristic of the input buffer may vary. In order to solve this problem, the delay time of the delay block 20 can be adjusted. A signal path in the delay block 20 can be revised in order to change the delay time of the delay block 20. For revising the signal path in the delay block 20, a process of a mask revision must be executed in conventional memory device.

If the ODT timing need be changed, a first mask revision should be executed, that is to say, the semiconductor must be fabricated again.

Also, conventionally, in situations where many memory devices are arranged in a module, each rank of the module can have a different timing of a data input/output. So, in accordance with characteristics of how a semiconductor memory device is arranged on each rank, an ODT timing for the arranged semiconductor memory device may be different.

All conventional semiconductor memory devices arranged on each rank operate to adjust the impedance of the input buffer using a predetermined spec margin. As all semiconductor memory devices arranged on each rank in the module have one common predetermined spec margin about the ODT timing, some semiconductor memory devices may not adjust the impedance of the input buffer properly because of short margin.

SUMMARY OF THE INVENTION

It is, therefore, an object of the present invention to provide a semiconductor memory device for adjusting the timing of ODT operation appropriately.

Also, it is an object of the present invention to provide a semiconductor memory device having an optimized ODT timing regardless of an arranged rank in a module.

In accordance with an aspect of the present invention, there is a semiconductor memory device, including an impedance adjusting unit for adjusting an impedance value of an input pad in response to an impedance selecting signal; an ODT operating control unit for controlling the impedance adjusting unit as generating the impedance selection signal using an decoding signal and an ODT timing signal; a delay adjusting unit for delaying an internal control clock for a predetermined timing to thereby generate the ODT timing signal; and an ODT timing control unit for controlling the delay adjusting unit to decide the value of the predetermined timing according to whether or not the semiconductor memory device is arranged to a first rank or a second rank in a module.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

An semiconductor memory device in accordance with specific embodiments of the present invention will be described in detail with reference to the accompanying drawings.

Figure 4:
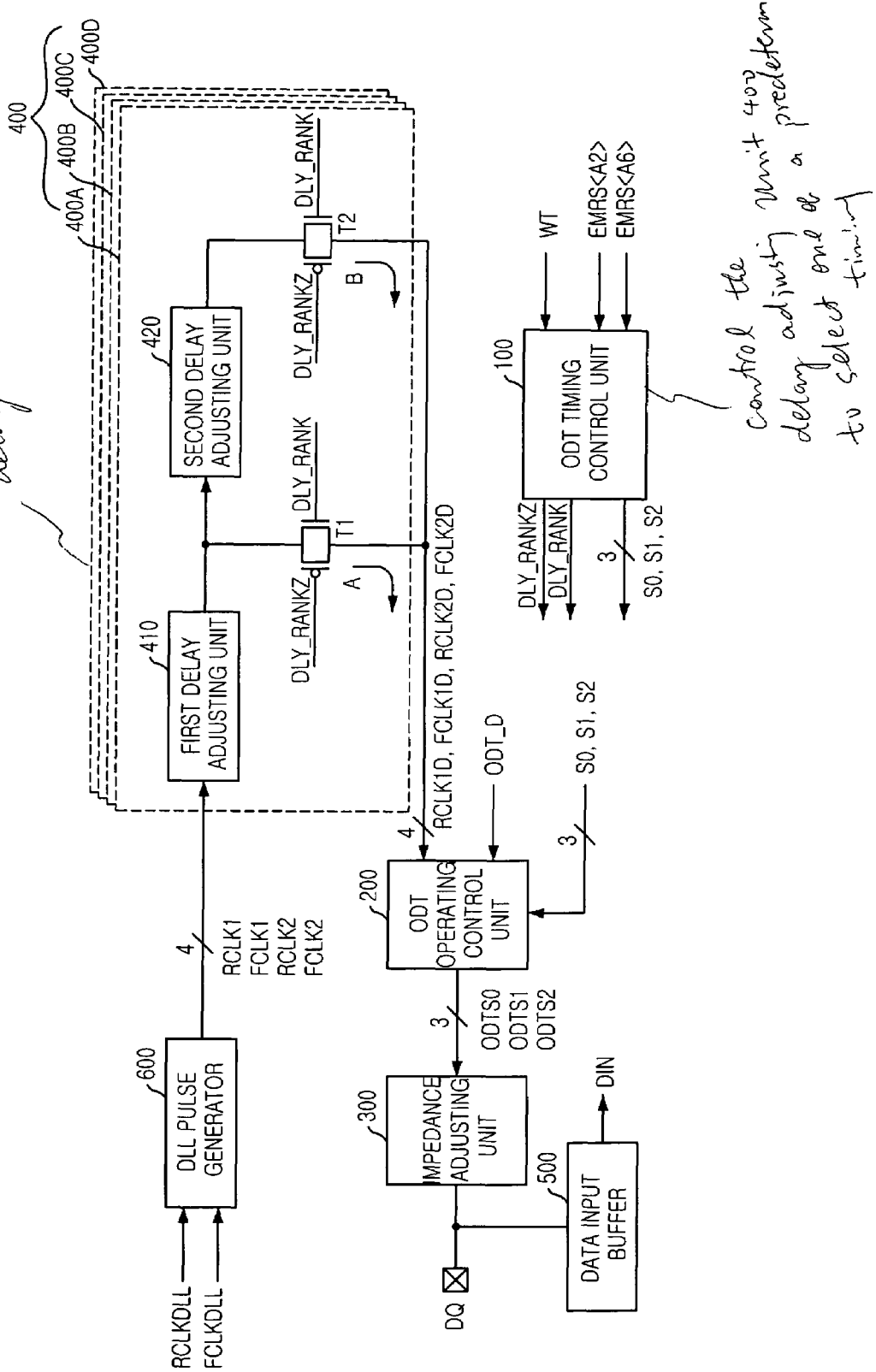
FIG. 4 is a block diagram showing a control of an ODT operation in accordance with an embodiment of the present invention.

FIG. 4 is a block diagram showing a control of an ODT operation in accordance with an embodiment of the present invention.

As shown, the semiconductor memory device in accordance with specific embodiments of the present invention for controlling an ODT operation includes an input pad DQ, an ODT timing control unit 100, an ODT operating control unit 200, an impedance adjusting unit 300, a delay adjusting unit 400, a data input buffer 500 and a DLL pulse generator 600.

The ODT timing control unit 100 controls the delay adjusting unit 400 to select a predetermined timing, i.e., one of the first timing and the second timing according to whether or not the semiconductor memory device is arranged to a first rank or a second rank of a module.

Herein, the first rank may be at one side in the module and the second rank may be at the other side in the module. Alternatively, the first rank may be in one area of a side in the module and the second rank may be in another area of the side in the module.

The ODT timing control unit 100 receives a command signal WT for a write operation and EMRS signals EMRS<A2> and EMRS<A6> inputted through an address input pad, and generates decoding signals S0, S1 and S2 and one of a first rank detection signal and a second rank detection signal. Herein, the first rank detection signal is a signal having a state that DIY_RANK has a logical level 'HIGH' and DIY_RANKZ has a logical level 'LOW' and the second rank detection signal is a signal having a state that DIY_RANK has a logical level 'LOW' and DIY_RANKZ has a logical level 'HIGH'. Herein after, it is declared as the first rank detection signal DIY_RANK, DIY_RANKZ and the second rank detection signal DIY_RANKZ, DIY_RANK. The ODT operating control unit 200 controls the impedance adjusting unit 300 to generate the impedance selection signal OSDS0, OSDS1 and OSDS2 based on decoding signal S0, S1 and S2 and the ODT timing signals RCLKD1D, FCLKD1D, RCLKD2D and FCLKD2D. The impedance adjusting unit 300 adjusts an impedance value of the input pad DQ in response to the impedance selection signals ODTS0, ODTS1 and ODTS2. The delay adjusting unit 400 delays an internal control clock RCLK1, RCLKE2, FCLK1 and FCLK2 generated for ODT operation for one of a first timing and a second timing to thereby generate the ODT timing signals RCLKD1D, FCLKD1D, RCLKD2D and FCLKD2D. The input pad DQ transfers an inputted data to the data input buffer 500. The data input buffer 500 transfer the data transferred by the input pad DQ to memory core block (not shown). The DLL pulse generator 600 receives delay locked clock RCLRCLL, FCLKDLL generated from a delay lock loop (DLL) circuit (not shown), and generates the internal control clock RCLK1, RCLKE2, FCLK1 and FCLK2 having a pulse form to the delay adjusting unit 400.

The delay adjusting unit 400 includes four delay adjusting block 400a to 400d arranged in parallel wherein each has substantially the same configuration and receives one of the internal control clock RCLK1, RCLKE2, FCLK1 and FCLK2 and generates one of the ODT timing signals RCLKD1D, FCLKD1D, RCLKD2D and FCLKD2D. Herein, only the delay adjusting block 400a is described in detail.

The delay adjusting block 400a includes a first delay adjusting unit 410, a second delay adjusting unit 420, a first transmission gate T1 and a second transmission gate T2. The first delay adjusting unit 410 delays the internal control clock RCLK1 for the first timing. The second delay adjusting unit 420 delays the output signal of the first delay adjusting unit 410 for the second timing. The first transmission gate T1 transfers an output of the first delay adjusting unit 410 as the ODT timing signal RCLKD1D to the ODT operating control unit 200 wherein the first transmission gate T1 is turned on in response to the first rank detection signal DIY_RANK, DIY_RANKZ outputted from the ODT timing control unit 100. The second transmission gate T2 transfers an output of the second delay adjusting unit 420 as the ODT timing signal RCLKD1D to the ODT operating control unit 200 wherein the second transmission gate T2 is turned on in response to the second rank detection signal DIY_RANKZ, DIY_RANK outputted from the ODT timing control unit. This is, the first transmission gate T1 uses a path A and the second transmission gate T2 uses apathB.

The ODT timing control unit 100 generates one of the first rank detection signal DIY_RANK, DIY_RANKZ and the second rank detection signal DIY_RANKZ, DIY_RANK according to whether or not the semiconductor memory device is arranged on the first rank or the second rank of a module. Therefore, one of the transmission gate T1, T2 is turned on and the delay timing of the delay adjusting unit 400 is decided. This is to say, the timing to input the ODT timing signal RCLKD1D, FCLKD1D, RCLKD2D and FCLKD2D to the ODT operating control unit 200 is decided.

Thereafter, the operating timing of the ODT operating control unit 200, i.e. an output timing of the impedance selection signals OSDS0, OSDS1 and OSDS2 to the impedance adjusting unit 300, is decided and the timing is decided for the impedance adjusting unit 300 to adjust the impedance of the input pad.

As a result, an optimized timing for adjusting the impedance of the input pad for ODT operation can be acquired regardless an arranged rank in a module.

Figure 5:
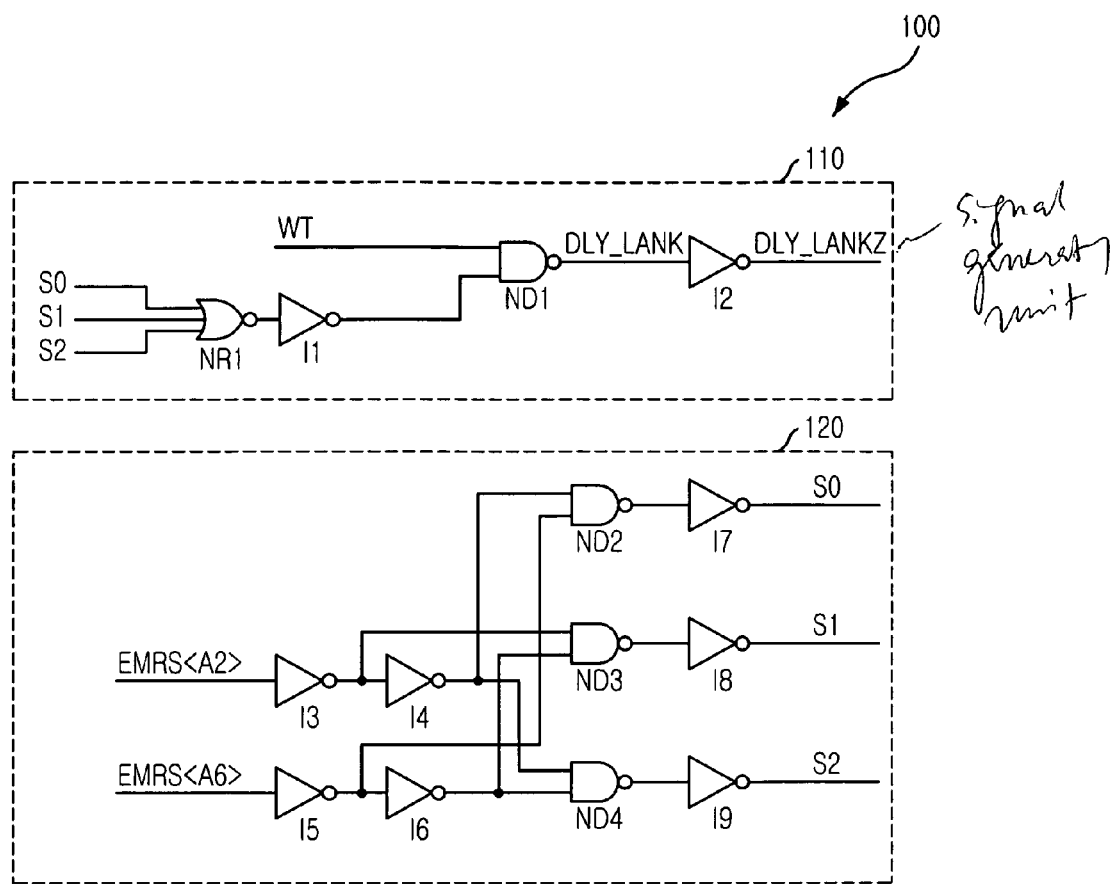
FIG. 5 is a schematic circuit diagram describing an ODT timing control unit.

FIG. 5 is a schematic circuit diagram describing an ODT timing control unit 100 shown in FIG. 4.

As shown, the ODT timing control unit 100 includes a signal generating unit 110 and a decoding unit 120. The signal generating unit 110 generates the first rank detection signal DIY_RANK, DIY_RANKZ or the second rank detection signal DIY_RANKZ, DIY_RANK in response to decoded signals S0, S1 and S2 wherein the signal generating unit 110 is enabled on a command signal WT for a write operation. The signal generating unit 110 includes a logic gate NR1 and I1 for working AND operation with the decoded signals S0, S1 and S2 and a logic gate ND1 for working NAND operation with the command signal WT for a write operation and the output of the invert I1 and a inverter I2 for working NOT operation with the output of the logic gate ND1.

The decoding unit 120 decodes EMRS signals EMRS<A2>, EMRS<A6> inputted through an address input pad and generates the decoded signals S0, S1 and S2 to the signal generating unit 110 and the ODT operating control unit 200. The decoding unit 120 includes a first inverter I3 for inverting the first EMRS signal EMRS<A2>, a second inverter I4 for inverting an output signal of the first inverter I3, a third inverter I5 for inverting the second EMRS signal EMRS<A6>, a fourth inverter I6 for inverting an output signal of the third inverter I5, a first AND gate ND3 and I7 for working AND operation with an output signal of the second inverter I4 and the output signal of the third inverter I5 and outputting a first decoding signal S0, a second AND gate ND3 and I8 for working AND operation with the output signal of the first inverter I3 and an output signal of the fourth inverter I6 and outputting a second decoding signal S1, a third AND gate ND4 and I9 for working AND operation with the output signal of the second inverter I4 and the output signal of the fourth inverter I6 and outputting a third decoding signal S2.

Figure 6:
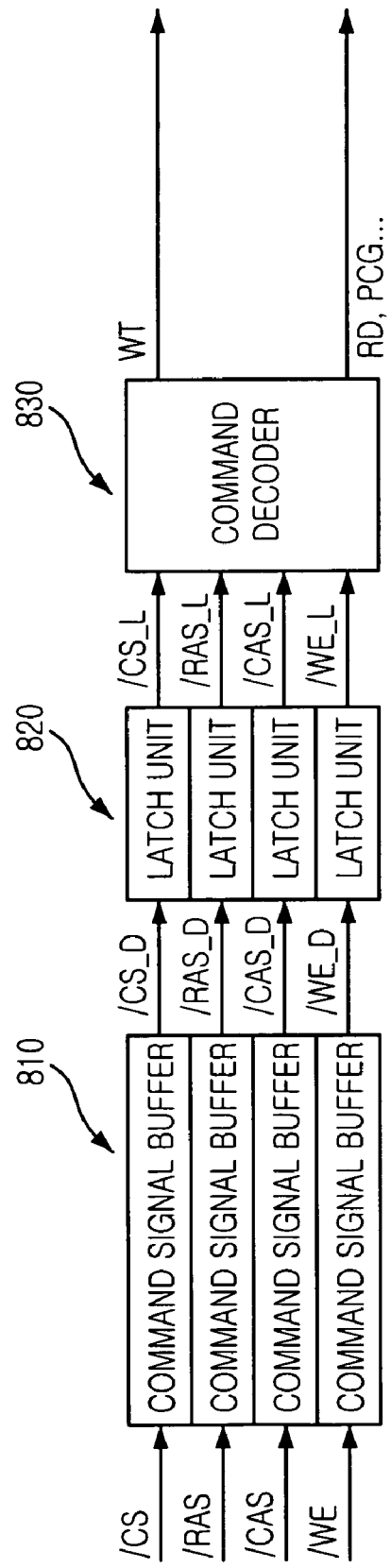
FIG. 6 is a command block diagram generating a signal WT.

FIG. 6 is a command block diagram generating a signal WT shown in FIG. 4.

As shown, the command block diagram generating a signal WT includes a plurality of command signal buffers 810, a plurality of latch units 820 and a command decoder 830. Each of the command signal buffers 810 receives and buffers one of command signals, i.e. /CS, /RAS, /CAS, /WE, and outputs the buffered command signal i.e. /CS_D, /RAS_D, /CAS_D, WE_D, to the plurality of latch units 820. Each of the latch unis 820 latches the buffered command signal and outputs the latched command signal, i.e. /CS_L, /RAS_L, /CAS_L, /WE_L, to the command decoder 830.

The command decoder 830 decodes the latched command signal and generates the command signal WT for writing operation and other command signal RD for read operation and PCG for precharge operation etc for other operation. As described to FIG. 4, the ODT timing control unit 100 uses the command signal WT for writing operation for generating one of the first rank detection signal DIY_RANK, DIY_RANKZ or the second rank detection signal DIY_RANKZ, DIY_RANK.

Figure 7:
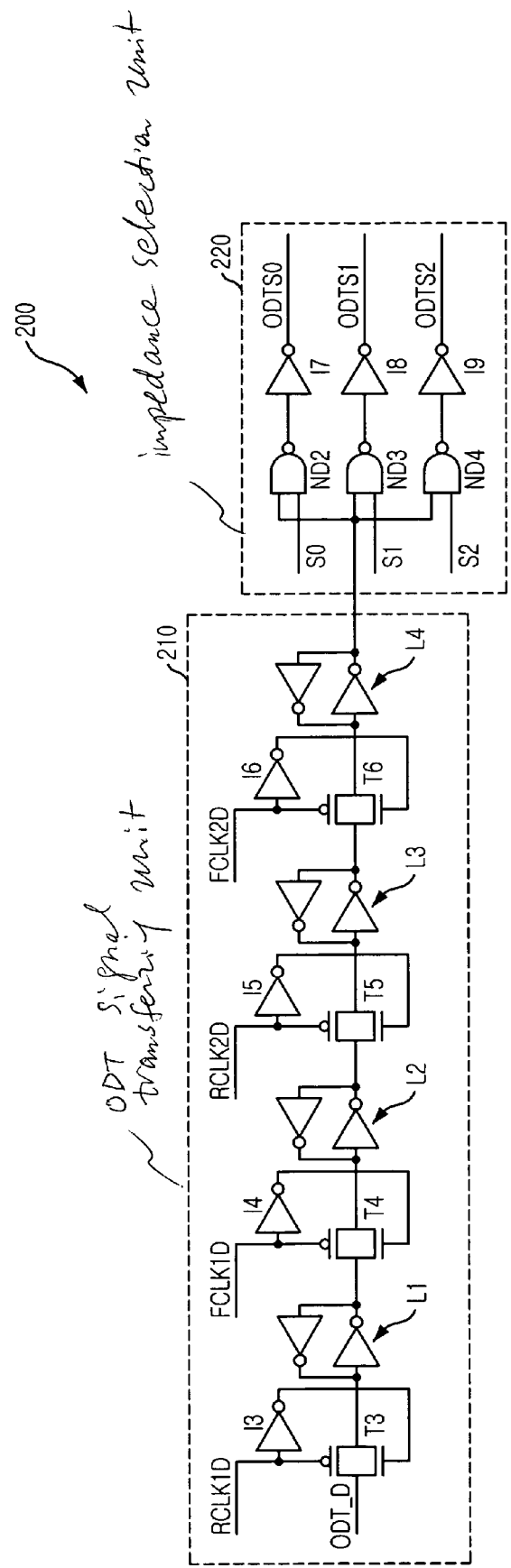
FIG. 7 is a schematic circuit diagram describing an ODT operating control unit.

FIG. 7 is a schematic circuit diagram describing an ODT operating control unit 200 shown in FIG. 4.

As shown, the ODT operating control unit 200 includes an ODT signal transferring unit 210 and an impedance selection unit 220.

The ODT signal transferring unit 210 latches the ODT signal ODT_D in response to the ODT timing signal RCLKD1D, FCLKD1D, RCLKD2D and FCLKD2D and transfers the ODT signal ODT_D to the impedance selection unit 220. The ODT signal transferring unit 210 includes transmission gates T3, T4, T5 and T6 for transferring the ODT timing signal ODT_D in response to the ODT timing signal RCLKD1D, FCLKD1D, RCLKD2D and FCLKD2D and latch units L1, L2, L3 and L4 for latching the transferred ODT timing signal ODT_D.

The impedance selection unit 220 activates one of the impedance selection signals ODTS0, ODTS1 and ODTS2 in accordance with the first to third decoding signal S0, S1 and S2 and the transferred ODT signal ODT_D. The impedance selection unit 220 includes a plurality of AND gates. The first AND gate ND2 and I7 effectuate an AND operation with the first decoding signal S0 and the transferred ODT timing signal ODT_D, and generates a first impedance selecting signal ODTS0 having a first information about a first input impedance value of the input pad DQ. The second AND gate ND3 and I8 effectuate an AND operation with the second decoding signal S1 and the transferred ODT timing signal ODT_D, and generates a second impedance selecting signal ODTS1 having a second information about a second input impedance value of the input pad DQ. The third AND gate ND4 and I9 effectuate an AND operation with the third decoding signal S2 and the transferred ODT timing signal ODT_D, and generates the third impedance selecting signal ODTS2 having a third information about a third input impedance value of the input pad DQ.

Figure 8:
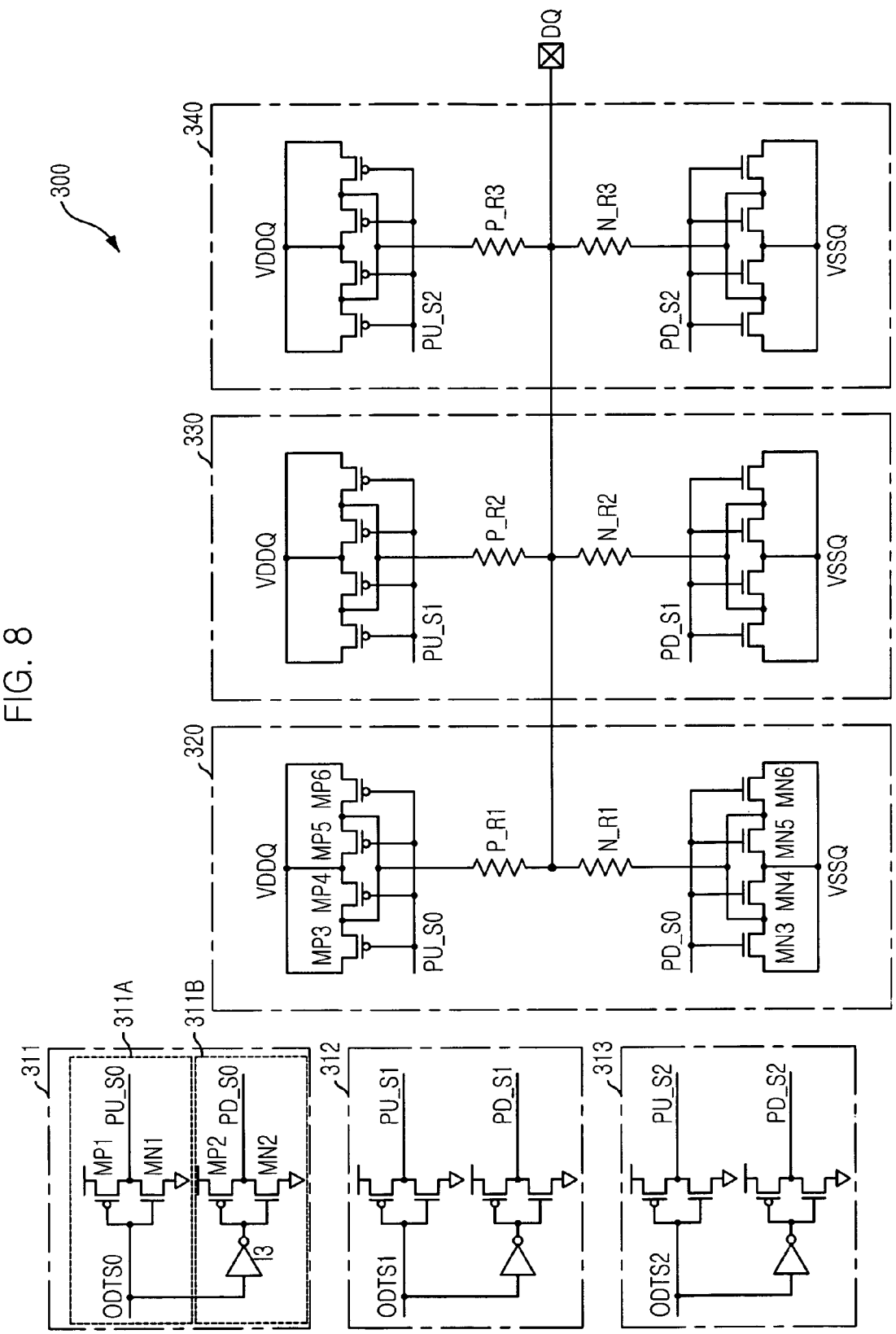
FIG. 8 is a schematic circuit diagram describing an impedance adjusting unit.

FIG. 8 is a schematic circuit diagram describing an impedance adjusting unit 300 shown in FIG. 4.

The impedance adjusting unit 300 includes a plurality of enable signal generating units 311, 312, 313 and a plurality of load units 320, 330, 340. The plurality of enable signal generating units 311, 312, 313 outputs respectively a first pair of enable signals PU_S0 and PD_S0, a second pair of enable signals PU_S1 and PD_S1, and a third pair of enable signals PU_S2 and PD_S2, wherein each enable signal corresponds respectively to the first impedance selecting signal ODTS0, the second impedance selecting signal ODTS1, and a third impedance selecting signal ODTS2. The plurality of load units 320, 330 and 340 arranged in the input pad in parallel change the impedance of the input pad in response to the first to third pairs of impedance enable signals PU_S0 and PD_S0, PU_S1 and PD_S1, PU_S2 and PD_S2.

The enable signal generating units 311 includes an inverter 311a and a buffer 311b. The inverter inverts the first impedance selecting signal ODTS0 and outputs the first enable signal PU_S0 for PMOS transistor. The buffer 311 b buffers the first impedance selecting signal ODTS0 and outputs the first enable signal PD_S0 for NMOS transistor.

The load unit 320 includes a first resistor P_R1 wherein a first terminal of the first resistor P_R1 is coupled to the input pad DQ and a second resistor N_R1 wherein a first terminal of the second resistor N_R1 is coupled to the input pad DQ, and a PMOS transistor MP3 for coupling a terminal of a power supply voltage VDDQ into the second terminal of the first resistor P_R1 wherein the PMOS is turned on the first enable signal PU_S0 for PMOS transistor, and a NMOS transistor MN3 for coupling a terminal of a power ground VSSQ into the second terminal of the second resistor N_R1 wherein the NMOS is turned on the first enable signal for NMOS transistor. Also, the load unit 320 includes a plurality of PMOS transistors MP3, MP4, MP5 and MP6 arranged on the second terminal of the first resistor P_R1 in parallel and a plurality of NMOS transistors MN3, MN4, MN5 and MN6 arranged on the second terminal of the second resistor N_R1 in parallel.

Figure 9:
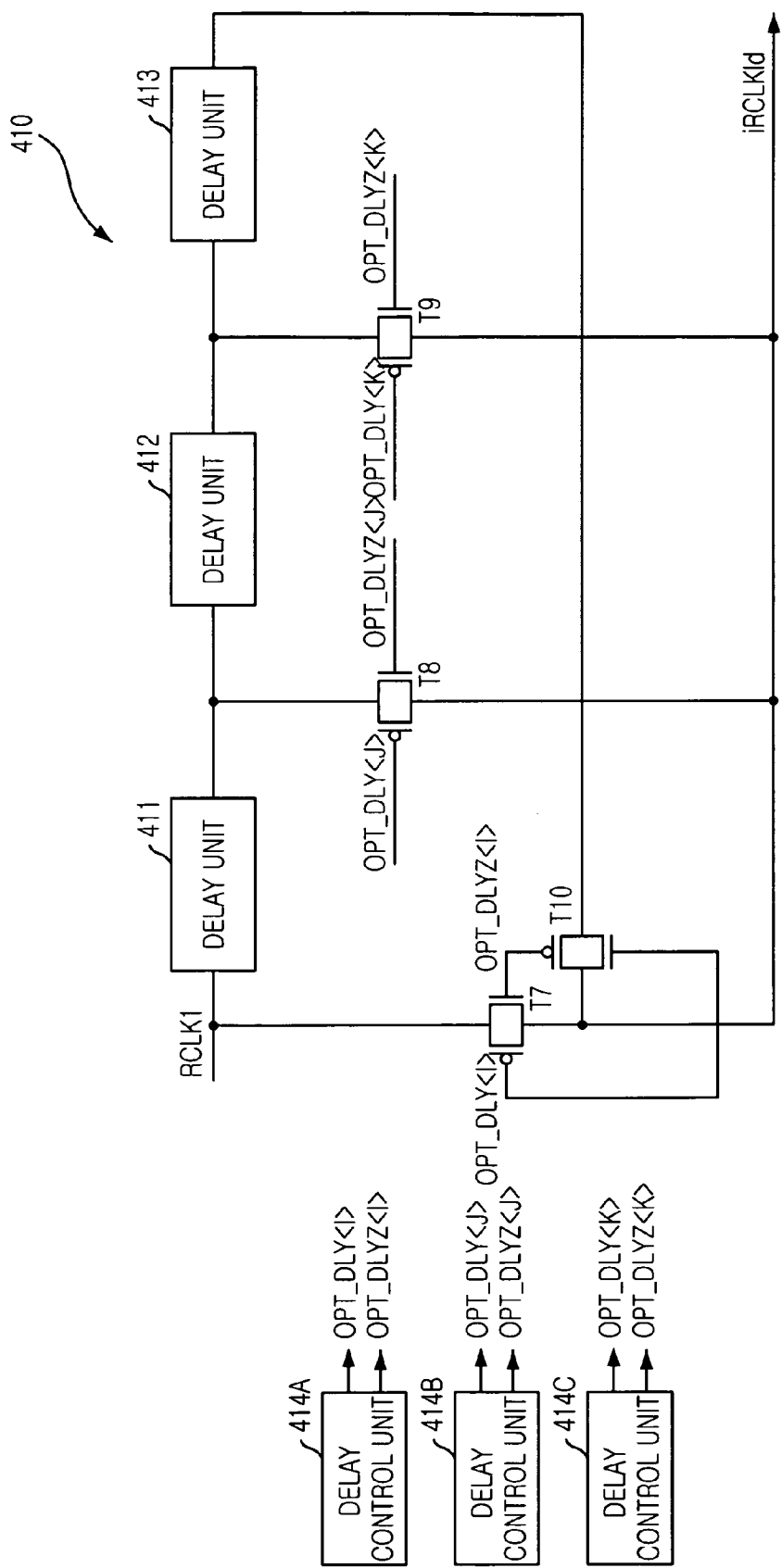
FIG. 9 is a block diagram describing a first delay adjusting unit.

FIG. 9 is a block diagram describing a first delay adjusting unit 410 shown in FIG. 4.

As shown, the first delay adjusting unit 410 includes a first delay unit 411 for delaying the ODT timing signal RCLK1 for a first predetermined timing, a second delay unit 412 for delaying an output signal of the first delay unit 411 for a second predetermined timing, a third delay unit 413 for delaying an output signal of the second delay unit 412 for a third predetermined timing, a first transmission gate T7 for transferring the ODT timing signal RCLK1, a second transmission gate T8 for transferring the output signal of the first delay unit 411, a third transmission gate T9 for transferring the output signal of the second delay unit 412, a forth transmission gate T10 for transferring the output signal of the third delay unit 413 and delay control units 414A to 414C for controlling one of the first to forth transmission gate T7~T10 enabled wherein a timing of adjusting the impedance of the input pad is decided in accordance with enabled one of the first to forth transmission gates T7~T10. Also, The first delay control unit 414A outputs a first delay timing signal OPT_DLY<I>, OPT_DLYZ<I> wherein one of the first transmission gate T7 and the forth transmission gate T10 is turned on in accordance with the logical level of the first delay timing signal OPT_DLY<I> and OPT_DLYZ<I>. The second delay control unit 414B outputs a second delay timing signal OPT_DLY<J> and OPT_DLYZ<J> wherein the second transmission gate T8 is turned on in response to the second delay timing signal OPT_DLY<J> and OPT_DLYZ<J>. The third delay control unit 414C outputs a third delay timing signal OPT_DLY<K> and OPT_DLYZ<K> wherein the third transmission gate T9 is turned on in response to the third delay timing signal OPT_DLY<K> and OPT_DLYZ<K>.

Figure 10:
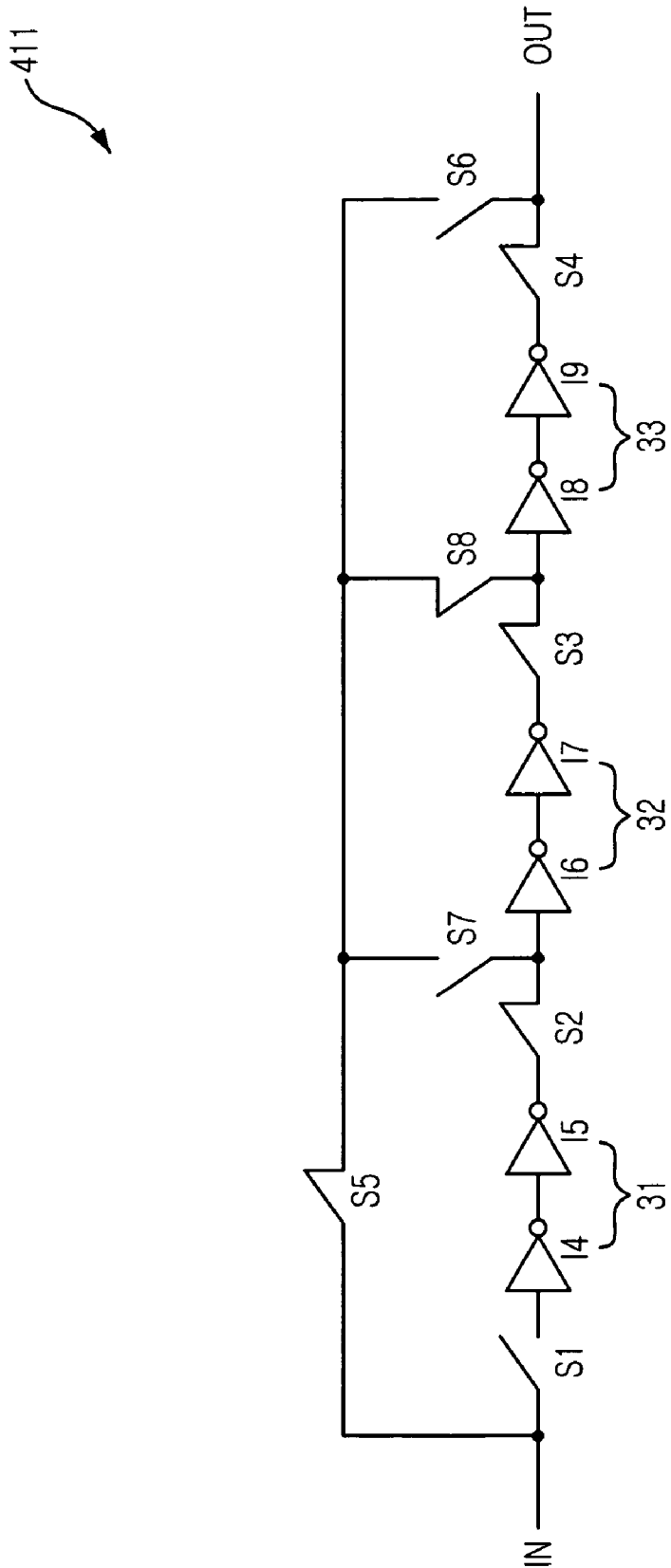
FIG. 10 is a schematic circuit diagram describing a delay unit.

FIG. 10 is a schematic circuit diagram describing a delay unit 411 shown in FIG. 9.

As shown, the delay unit 411 includes a first to a third buffer 31, 32, 33 arranged in series, a first switch means S1 for coupling an signal input terminal IN and an input terminal of the first buffer 31, a second switch means S2 for coupling an output terminal of the first buffer 31 and an input terminal of the second buffer B2, a third switch means S3 for coupling an output terminal of the second buffer 32 and an input terminal of the third buffer 33, a forth switch means S4 for coupling an output terminal of the third buffer 33 and a signal output terminal OUT, a fifth switch means S5 having a first terminal coupled to the signal input terminal IN, a sixth switch means S6 having a first terminal coupled to a second terminal of the fifth switch means S5 and a second terminal coupled to the signal output terminal OUT, a seventh switch means S7 having a first terminal coupled to a second terminal of the fifth switch means S5 and a second terminal coupled to the input terminal of the second buffer 32, and an eighth switch means S8 having a first terminal coupled to a second terminal of the fifth switch means S5 and a second terminal coupled to the input terminal of the third buffer 33.

Figure 11:
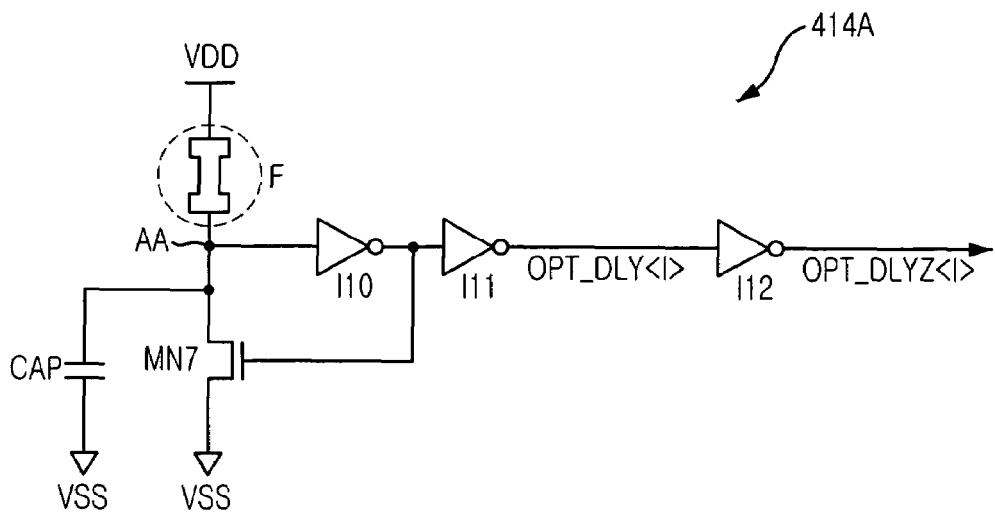
FIG. 11 is a schematic circuit diagram describing a delay control unit.

FIG. 11 is a schematic circuit diagram describing a delay control unit 414A shown in FIG. 9.

As shown, the delay control unit 414A includes a fuse F having a first terminal coupled to a power supply voltage VDD, a capacitor CAP having a first terminal coupled to a second terminal of the fuse F and a second terminal coupled to a power ground voltage VSS, a first inverter I10 having an input terminal coupled the second terminal of the fuse F, a NMOS transistor MN7 having a drain coupled to the second terminal of the fuse F, a source coupled to the power ground VSS and a gate coupled to an output terminal of the first inverter I10, a second inverter I11 for inverting an output signal of the first inverter I10 and outputting an output signal for turning on the first transmission gate T7, a third inverter I12 for inverting an output of the second inverter I11 and outputting an output signal for turning on the forth transmission gate T10.

Figure 12:
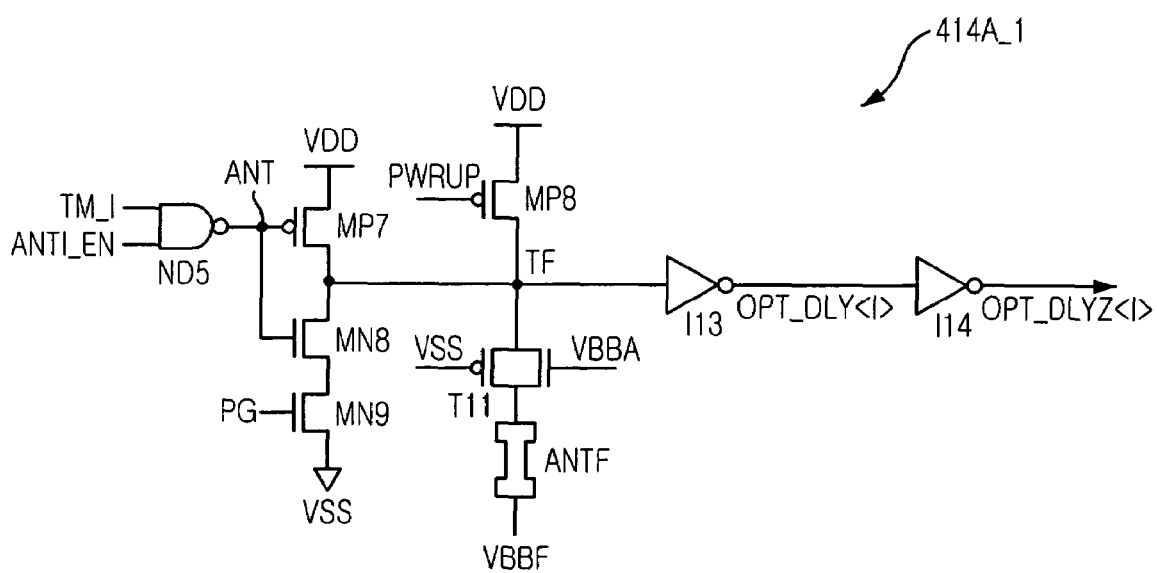
FIG. 12 is a schematic circuit diagram describing a delay control unit in accordance with another embodiment of the present invention.

FIG. 12 is a schematic circuit diagram describing a delay control unit 414A_1 in accordance with another embodiment of the present invention.

As shown, the first delay control unit 414A_1 includes a first PMOS transistor MP7 having a first terminal coupled to a power supply voltage VDD and a gate coupled to an anti-fuse control signal ANT, a first NMOS transistor MN8 having a first terminal coupled to the first terminal of the first PMOS transistor MP7 and a gate coupled to the anti-fuse control signal ANT, a second NMOS transistor MN9 having a gate coupled to an anti-fuse enable signal PQ a first terminal coupled to a second terminal of the first NMOS transistor MN8 and a second terminal coupled to a power ground VSS, a second PMOS transistor MP8 having a gate coupled to an power-up signal PWRUP, a first terminal coupled to the power voltage VDD and a second terminal coupled to the first terminal of the first NMOS transistor MN8, an anti-fuse ANTF having a first terminal coupled to the first terminal of the first NMOS transistor MN8 and a second terminal coupled to a anti-fuse voltage VBBF for cutting operation of the anti-fuse ANTF, a first inverter I13 for inverting an output signal of the first terminal of the first NMOS transistor MN8 and outputting an output signal OPT_DLY<I> for turning on the first transmission gate T7; and a second inverter I14 for inverting an output of the first inverter I13 and outputting an output signal for turning on the forth transmission gate T10. Also, a transmission gate T11 is arranged between the anti-fuse and the node TF. The transmission gate T11 receives a power ground VSS and a voltage VBBA for anti-fuse operation and is always turned on while the semiconductor memory device is activated.

Herein, the anti-fuse control signal ANT is an output of a NAND logic gate ND5. The NAND logic gate ND5 receives a test signal TM_I and an anti-fuse enable signal ANTI_EN and generates the anti-fuse control signal ANT.

The test signal TM_I is a signal activated in response to a test mode. The anti-fuse enable signal ANTI_EN is an enable signal for activating the delay control unit 414A_1. The anti-fuse voltage VBBF has a voltage level for shorting the anti-fuse. If a critical voltage is provided between both terminals of the anti-fuse, the anti-fuse will be broken down and both terminals of the anti-fuse will be short. The power-up signal PWRUP is a signal provided from a power voltage detection circuit (not shown) after a critical level of the power voltage is supplied to the semiconductor memory device.

Further, the constructions of the second and third delay control units 414B, 414C are the same as that of the first delay control unit 414A. Accordingly, the detailed description of the second and third delay control units 414B, 414C is omitted for the sake of convenience.

Hereinafter, an operation of adjusting timing for the ODT operation according to the present invention is described in detail with reference to FIGS. 4 to 12.

Described as above, a semiconductor memory device is used as one of a plurality of devices of a module in PCB. The module having the semiconductor memory device has at least two ranks.

Herein, a rank is a block that handles a number of data bits that are outputted/inputted between the Chipset and the module.

For example, sixteen semiconductor memory devices can be arranged in a module wherein each semiconductor memory device can output 8 bits of data and the total number of data bit is 64 between the Chipset and the module at one operation for data access, and the module has two ranks. Each rank in the module inputs/outputs 64 bits data.

Further, the first rank may locate at one side in the module and the second rank may locate at the other side in the module. Alternatively, the first rank may correspond to one area of a side in the module and the second rank may correspond to a different area of the side in the module.

Each load of data transmission lines between each rank and the Chipset is different since each rank of the module individually exchanges data with the Chipset and the path between each rank and the Chipset is different. Each of semiconductor memory device arranged in the module has a timing margin for adjusting an impedance of an input pad in order to remove a reflection of an inputted data signal. Therefore, the timing margin for adjusting an impedance of the input pad for ODT operation should be different in according with each rank arranging the memory device.

The semiconductor memory device of the present invention has an optimized timing margin for adjusting an impedance of input pad for ODT operation regardless of where ranks are arranged in the semiconductor memory device.

For instance, if the semiconductor memory device is arranged in the first rank of the module, the ODT timing control unit 100 turns the transmission gate T1 on. Then, the semiconductor memory device adjusts an impedance of input pad for ODT operation for the first timing margin. Likewise, if the semiconductor memory device is arranged in the second rank of the module, the ODT timing control unit 100 turns the transmission gate T2 on. The n, the semiconductor memory device adjusts an impedance of input pad for ODT operation for the second timing margin.

That is, the ODT timing signals RCLKD1D, FCLKD1D, RCLKD2D and FCLKD2D outputted from the delay adjusting unit 400 are used as a reference signal for deciding a timing of the ODT operation in the semiconductor memory device.

As the semiconductor memory device adjusts the delay timing of the delay adjusting unit 400, the output timings of the ODT timing signal RCLKD1D, FCLKD1D, RCLKD2D and FCLKD2D are determined.

Consequently, the timings of the impedance selection signals outputted from the ODT operating unit 200 for controlling the impedance adjusting unit 300 are decided; and the impedance adjusting unit 300 adjusts the impedance of the input pad DQ according to the impedance selection signals. Therefore, the semiconductor memory device of the present invention has an optimized timing margin for the ODT operation.

In detail, the decoding unit 110 for the ODT timing control unit 100 decodes the EMRS signals EMRS<A2> and EMRS<A6> to generate the decoded signals S0, S1 and S2.

The signal out unit 110 of the ODT timing control unit 100 receives the decoded signals S0, S1 and S2 and the command signal WT for write operation to generates one of the first rank detection signal DIY_RANK, DIY_RANKZ or the second rank detection signal DIY_RANKZ, DIY_RANK. A s a result, the path of transferring the internal control clocks RCLK1, RCLKE2, FCLK1 and FCLK2 into the ODT timing signal RCLK1, FCLK1, RCLK2 FCLK2 is decided. Namely, the delay time of the delay adjusting unit 400 is decided.

The ODT operation control unit 200 receives the ODT signal ODT_D from an external circuit in synchronization with the ODT timing signals RCLK1, FCLK1 and RCLK2 FCLK2 and activates one of the impedance selection signals ODTS0, ODTS1 and ODTS2 in response with the decoded signal S0, S1 and S2 and the received ODT signal.

The impedance adjusting unit 300 adjusts the impedance of the input pad DQ in response with an activated one of the impedance selection signals ODTS0, ODTS1 and ODTS2. For example, the impedance adjusting unit 300 adjusts the impedance of the input pad DQ to one of 50 ohm, 75 ohm and 150 ohm. As the impedance adjusting unit 300 controls the plurality of load units 320, 330 and 340 selectively enabled by the impedance selection signals ODTS0, ODTS1 and ODTS2, the impedance adjusting unit 300 provides the predetermined impedance to the input pad. If the impedance of the input pad is changed to a predetermined optimized impedance value, a data signal can be inputted to the input pad without reflection of the data signal.

Figure 1:
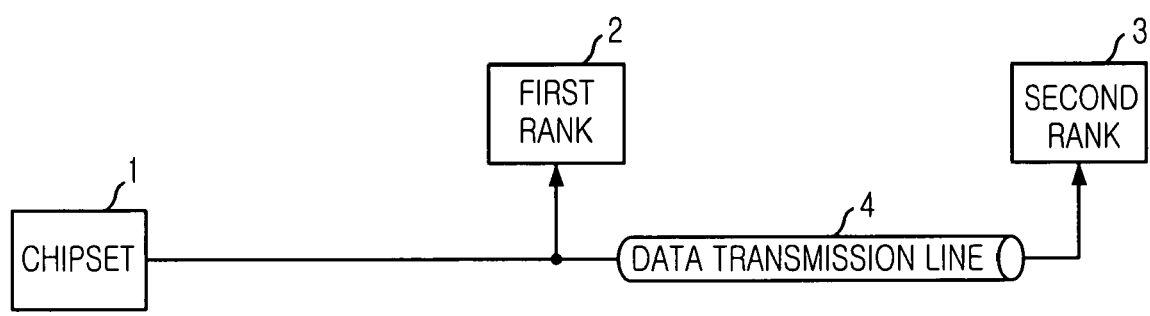
FIG. 1 is a block diagram illustrating a module for putting a semiconductor memory device.
Figure 2:
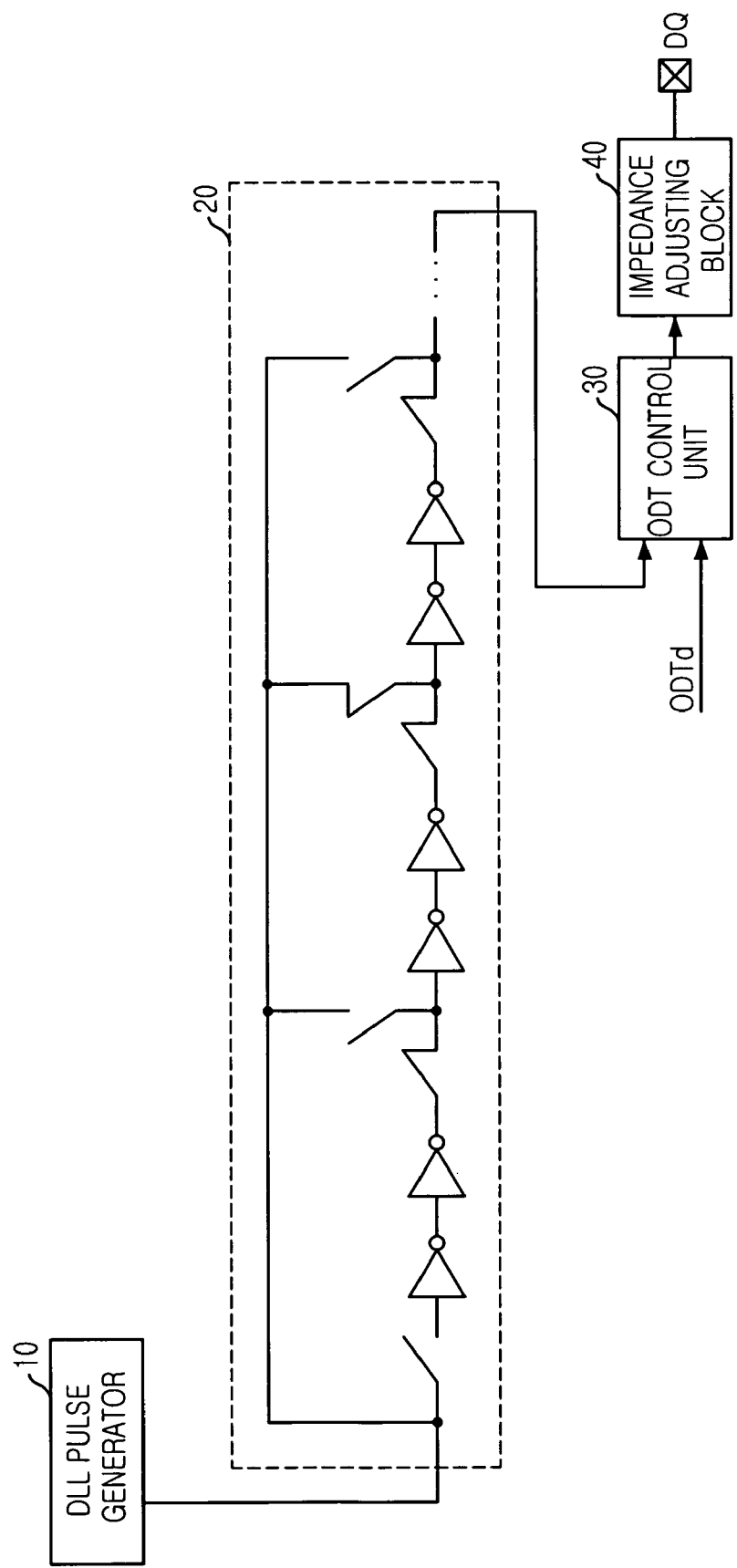
FIG. 2 is a schematic diagram illustrating a conventional circuit for controlling ODT used in a semiconductor memory device.
Figure 3:
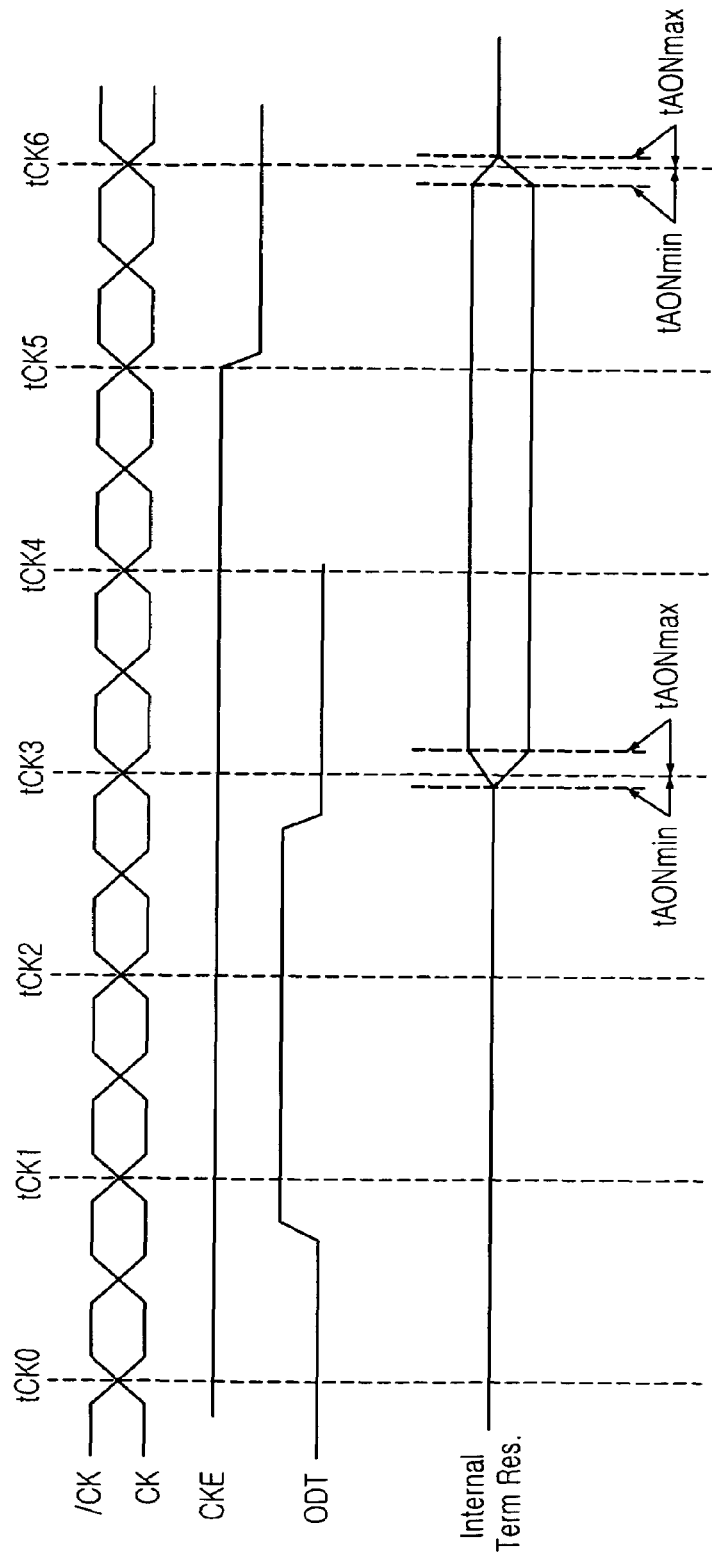
FIG. 3 is a waveform and table illustrating a JDEC specification about ODT operation.

On the other hand, as shown in the FIG. 3, the operation timings about the input timing of the ODT signal ODT_D and the adjusting timing of the impedance of the input pad is defined as a tAON and a tAOF in a specification of the semiconductor memory device.

Under a process environment, the conventional semiconductor memory device can have a drawback in terms of operation timings related to the above specification a tAON and a tAOF. In this case, as the semiconductor memory device of the present invention changes the delay timing of the first delay adjusting 410 or the second delay adjust unit 420, the drawback of the operation timing about the pre-described specification a tAON and tAOF can be overcome.

By enabling one of the transmission gates T7, T8, T9 and T10 in to the first delay adjust unit 410, the delay time of the first delay adjusting 410 is decided.

The delay control units 414A, 414B and 414C generate the first delay timing signal OPT_DLY<I> and OPT_DLYZ<I>, the second delay timing signal OPT_DLY<J> and OPT_DLYZ<J>, the third delay timing signal OPT_DLY<K> and OPT_DLYZ<K>, respectively. The signals that the delay control units 414A, 414B and 414C generate are selectively enabled. Then, the transmission gates T7, T8, T9 and T10 are selectively turned on, each of which yields a different Then, the delay time of the first delay adjusting 410.

Each of the delay control units 414A, 414B and 414C has a fuse or an anti-fuse in order to generate each activated output signal.

In case when each of delay control units 414A, 414B and 414C uses a fuse, each of delay control units 414A, 414B and 414C is constructed as the circuit as shown FIG. 11. If the fuse F of the delay control unit 414A is blown out, the first delay timing signal OPT_DLY<I>/OPT_DLYZ<I> is activated.

When each of delay control units 414A, 414B and 414C uses ant-fuse ANTF, each of delay control units 414A, 414B and 414C is constructed as the schematic circuit shown in FIG. 12. When the test mode signal TM_I and the anti-fusenable signal are activated, if the anti-fuse voltage VBBF is supplied and the anti-fuse control signal ANT is activated, the anti-fuse ANTF is cut and then the enabled delay timing signal OPT_DLY<I>/OPT_DLYZ<I> is activated.

As the first or second delay adjusting unit 410 and 420 adjusts the delay time, distortion of the operation timing about the tAON and tAOF can be revised.

Further, while a semiconductor memory device of one rank accesses data, the other semiconductor memory device of the other rank can be ODT operation. In this case, the ODT timing control unit 100 turns one of the transmission gate T1 and the transmission gate T2 on. Then, each semiconductor memory device can have the optimized timing of ODT operation.

Described as above, the semiconductor memory device of the present invention can have an optimized timing about ODT operation regardless of a location of the rank arranged in the semiconductor memory device. In addition, the semiconductor memory device of the present invention can have an optimized timing about ODT operation regardless of a fabricating environment, because the distortion of the operation timing about the tAON and tAOF can be repaired.

Therefore, a plurality of data can be inputted stably and reliably in series with a high speed into semiconductor memory device.

The present application contains subject matter related to the Korean patent application No. KR 2005-0058712, filed in the Korean Patent Office on Jun. 60, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A semiconductor memory device, comprising:
an impedance adjusting unit for adjusting an impedance value of an input pad in response to an impedance selecting signal;
an ODT operating control unit for generating the impedance selection signal using an decoding signal and an ODT timing signal;
a delay adjusting unit for delaying an internal control clock for a predetermined timing to thereby generate the ODT timing signal; and
an ODT timing control unit for determining the value of the predetermined timing according to whether the semiconductor memory device is arranged in a first rank or a second rank of a module.

2. The device as recited in claim 1, wherein the delay adjusting unit includes:
a first delay adjusting unit for delaying the internal control clock for a first timing;
a second delay adjusting unit for delaying an output of the first delay adjusting unit for a second timing;
a first transmission gate for transferring the output of the first delay adjusting unit as the ODT timing signal to the ODT operation control unit wherein the first transmission gate is turned on in response to a first rank detection signal; and
a second transmission gate for transferring an output of the second delay adjusting unit as the ODT timing signal to the ODT operation control unit wherein the second transmission gate is turned on in response to a second rank detection signal.

3. The device as recited in claim 2, wherein the ODT timing control unit includes:
a signal generating unit for generating the first rank detection signal or the second rank detection signal in response to decoded signals wherein the signal generating unit is enabled by a command signal for a write operation; and
a decoding unit for decoding EMRS signals inputted to an address input pad and generating the decoded signals to the signal generating unit.

4. The device as recited in claim 3, wherein the signal generating unit includes:
a logic gate for an OR operation on the decoded signals;
a NAND gate for an NAND operation on the command signal and an outputted signal of the logic gate and outputting the first rank detection signal; and
an inverter for inverting an outputted signal of the NAND gate and outputting the second rank detection signal.

5. The device as recited in claim 3, wherein the decoding unit includes:
a first inverter for inverting a first EMRS signal;
a second inverter for inverting an output signal of the first inverter;
a third inverter for inverting a second EMRS signal;
a fourth inverter for inverting an output signal of the third inverter;
a first AND gate for an AND operation on an output signal of the second inverter and the output signal of the third inverter and outputting a first decoding signal;
a second AND gate for an AND operation on the output signal of the first inverter and an output signal of the fourth inverter and outputting a second decoding signal; and
a third AND gate for an AND operation on the output signal of the second inverter and the output signal of the fourth inverter and outputting a third decoding signal.

6. The device as recited in claim 5, wherein the ODT operating control unit includes:
an ODT signal transferring unit for latching and transferring the ODT signal in response to the ODT timing signal; and
an impedance selection unit for receiving the transferred ODT signal and outputting the same as the impedance selection signal in accordance with the first to third decoding signals.

7. The device as recited in claim 6, wherein the ODT signal transferring unit includes:
a transmission gate for transferring the ODT timing signal in response to the ODT timing signal; and
a latch unit for latching the transferred ODT timing signal.

8. The device as recited in claim 6, wherein the impedance selection unit includes:
a first AND gate for an AND operation on the first decoding signal and the transferred ODT timing signal and generating a first impedance selecting signal having a first information about a first input impedance value of the input pad;
a second AND gate for an AND operation on the second decoding signal and the transferred ODT timing signal and generating a second impedance selecting signal having a second information about a second input impedance value of the input pad; and
a third AND gate for an AND operation on the third decoding signal and the transferred ODT timing signal and generating a third impedance selecting signal having a third information about a third input impedance value of the input pad.

9. The device as recited in claim 8, wherein the impedance adjusting unit includes:
a plurality of enable signal generating units for outputting respectively a first enable signal, a second enable signal, and a third enable signal, wherein each enable signal corresponds to respectively the first impedance selecting signal, the second impedance selecting signal and the third impedance selecting signal; and
a plurality of load units arranged in the input pad in parallel for changing the impedance of the input pad in response to the first to third impedance enable signals.

10. The device as recited in claim 9, wherein the enable signal generating units include:
an inverter for inverting the first impedance selecting signal and outputting the first enable signal for a PMOS transistor; and
a buffer for buffering the first impedance selecting signal and outputting the first enable signal for the NMOS transistor.

11. The device as recited in claim 10, wherein the load units include:
a first resistor wherein a first terminal of the first resistor is coupled to the input pad;
a second resistor wherein a first terminal of the second resistor is coupled to the input pad;
a PMOS transistor for coupling a terminal of a power supply into the second terminal of the first resistor wherein the PMOS is turned on the first enable signal for PMOS transistor; and
a NMOS transistor for coupling a terminal of a power ground into the second terminal of the second resistor wherein the NMOS is turned on the first enable signal for NMOS transistor.

12. The device as recited in claim 11, wherein the load unit includes a plurality of PMOS transistors arranged in the second terminal of the first resistor in parallel and a plurality of NMOS transistors arranged in the second terminal of the second resistor in parallel.

13. The device as recited in claim 2, wherein the first delay adjusting unit includes:
a first delay for delaying the ODT timing signal for a first predetermined timing;
a second delay for delaying an output signal of the first delay for a second predetermined timing;
a third delay for delaying an output signal of the second delay for a third predetermined timing;
a first transmission gate for transferring the ODT timing signal;
a second transmission gate for transferring the output signal of the first delay;
a third transmission gate for transferring the output signal of the second delay;
a forth transmission gate for transferring the output signal of the third delay; and
a delay control unit for controlling one of the first to forth transmission gate enabled wherein a timing of adjusting the impedance of the input pad is decided in accordance with enabled one of the first to forth transmission gates.

14. The device as recited in claim 13, the delay control unit includes:
a first delay control unit for outputting a first delay timing signal wherein one of the first transmission gate and the fourth transmission gate is turned on in accordance with a logical level of the first delay timing signal.
a second delay control unit for outputting a second delay timing signal wherein the second transmission gate is turned on in response to the second delay timing signal; and
a third delay control unit for outputting a third delay timing signal wherein the third transmission gate is turned on in response to the third delay timing signal.

15. The device as recited in claim 14, wherein each delay control unit includes:
a first to a third buffer arranged in series;
a first switch means for coupling a signal input terminal and an input terminal of the first buffer;
a second switch means for coupling an output terminal of the first buffer and an input terminal of the second buffer;
a third switch means for coupling an output terminal of the second buffer and an input terminal of the third buffer;
a fourth switch means for coupling an output terminal of the third buffer and a signal output terminal;
a fifth switch means having a first terminal coupled to the signal input terminal;
a sixth switch means having a first terminal coupled to a second terminal of the fifth switch means and a second terminal coupled to the signal output terminal;
a seventh switch means having a first terminal coupled to a second terminal of the fifth switch means and a second terminal coupled to the input terminal of the second buffer; and
an eighth switch means having a first terminal coupled to a second terminal of the fifth switch means and a second terminal coupled to the input terminal of the third buffer.

16. The device as recited in claim 14, wherein each delay control unit further includes:
a fuse having a first terminal coupled to a power voltage;
a capacitor having a first terminal coupled to a second terminal of the fuse and a second terminal coupled to a power ground;
a first inverter having an input terminal coupled to the second terminal of the fuse;
a NMOS transistor having a drain coupled to the coupled second terminal of the fuse, a source coupled to the power ground and a gate coupled to an output terminal of the first inverter;
a second inverter for inverting an output signal of the first inverter and outputting an output signal for turning on the first transmission gate; and
a third inverter for inverting an output of the second inverter and outputting an output signal for turning on the forth transmission gate.

17. The device as recited in claim 14, wherein each delay control unit includes:

a first PMOS transistor having a first terminal coupled to a power voltage and a gate coupled to an anti-fuse control signal;

a first NMOS transistor having a first terminal coupled to the first terminal of the first PMOS transistor and a gate coupled to the anti-fuse control signal;

a second NMOS transistor having a gate coupled to an anti-fuse enable signal, a first terminal coupled to a second terminal of the first NMOS transistor and a second terminal coupled to a power ground;

a second PMOS transistor having a gate coupled to a power-up signal, a first terminal coupled to the power voltage and a second terminal coupled to the first terminal of the first NMOS transistor;

a anti-fuse having a first terminal coupled to the first terminal of the first NMOS transistor and a second terminal coupled to a anti-fuse voltage for cutting operation of the anti-fuse;

a first inverter for inverting an output signal of the first terminal of the first NMOS transistor and outputting an output signal for turning on the first transmission gate; and a second inverter for inverting an output of the first inverter and outputting an output signal for turning on the forth transmission gate.

* * * * *